US006642589B2

United States Patent
Wada et al.

(10) Patent No.: US 6,642,589 B2
(45) Date of Patent: Nov. 4, 2003

(54) SEMICONDUCTOR DEVICE HAVING POCKET AND MANUFACTURE THEREOF

(75) Inventors: Hajime Wada, Kawasaki (JP); Kenichi Okabe, Kasugai (JP); Kou Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/266,689

(22) Filed: Oct. 9, 2002

(65) Prior Publication Data

US 2003/0030112 A1 Feb. 13, 2003

Related U.S. Application Data

(62) Division of application No. 10/046,978, filed on Jan. 17, 2002, now Pat. No. 6,483,155.

(30) Foreign Application Priority Data

Jun. 29, 2001 (JP) ........................................ 2001-198594

(51) Int. Cl.[7] ......................................... H01L 21/8238
(52) U.S. Cl. ...................... 257/397; 438/231; 438/232; 438/305
(58) Field of Search ................................. 438/199, 163, 438/231, 232, 301, 302, 303, 305, 306, 307; 257/336, 350, 369, 408

(56) References Cited

U.S. PATENT DOCUMENTS 5,780,912 A    7/1998  Burr et al. ................... 257/408
5,821,147 A *  10/1998 Kizilyalli .................... 438/305
6,207,999 B1   3/2001  Wu ............................. 257/390
6,251,718 B1 * 6/2001  Akamatsu et al. .......... 438/217
6,281,555 B1   8/2001  Yu et al. ..................... 257/374

FOREIGN PATENT DOCUMENTS

| JP | 9-246553  | 9/1997 |
| JP | 11-87706  | 3/1999 |
| JP | 11-261069 | 9/1999 |
| JP | 2000-36082 | 2/2000 |

* cited by examiner

*Primary Examiner*—Phat X. Cao
*Assistant Examiner*—Theresa T. Doan
(74) *Attorney, Agent, or Firm*—Armstrong, Westerman & Hattori, LLP

(57) ABSTRACT

A semiconductor device has first and second active regions defined on the principal surface of a silicon substrate, a first n-channel MOS transistor formed in the first active region and having first extension regions and first pocket regions being deeper than the first extension regions and being doped with indium at a first concentration, and a second n-channel MOS transistor formed in the second active region and having second extension regions and second pocket regions being deeper than the second extension regions and being doped with indium at a second concentration lower than the first concentration. Boron ions may be implanted into the second pocket regions. The pocket regions can be formed by implanting indium ions and an increase in leak current to be caused by indium implantation can be reduced.

8 Claims, 8 Drawing Sheets

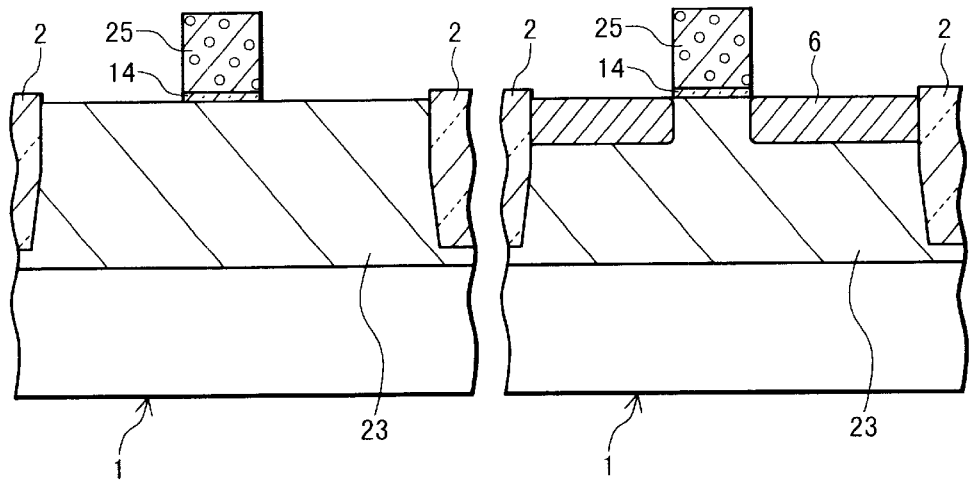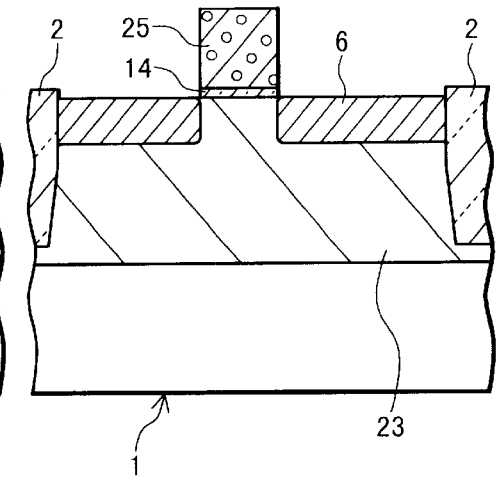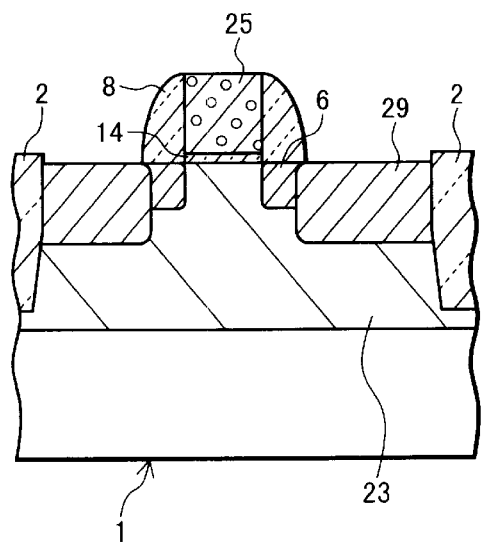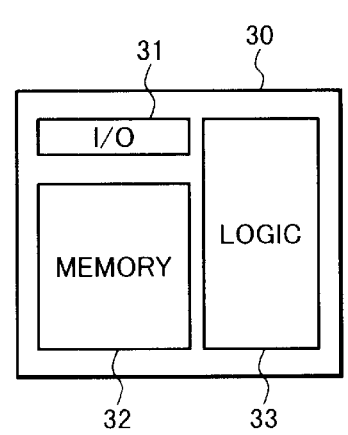

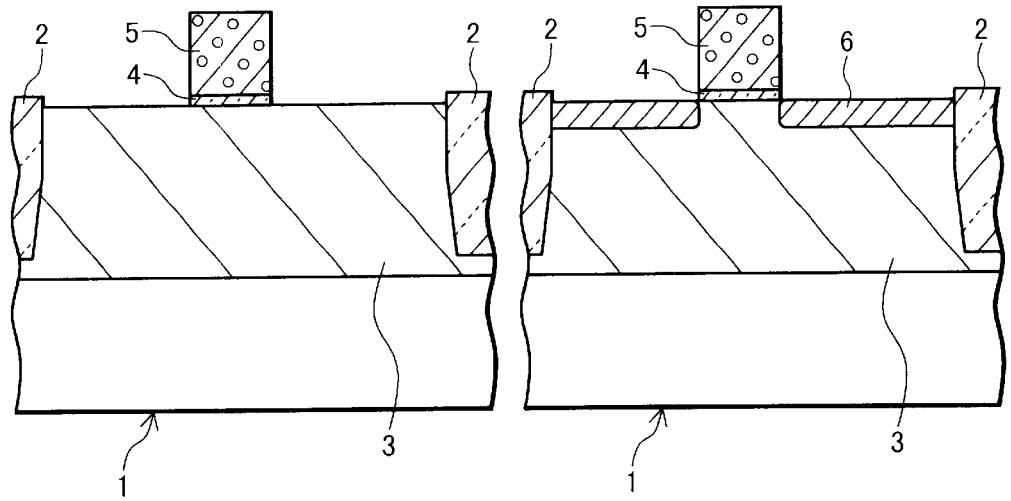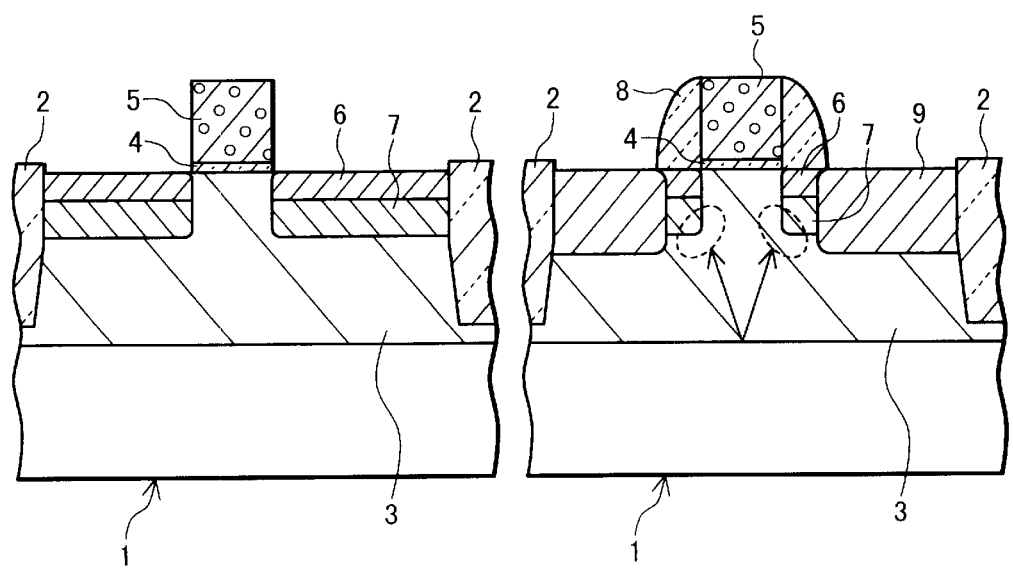
FIG.4A PRIOR ART
FIG.4B PRIOR ART
FIG.4C PRIOR ART
FIG.4D PRIOR ART

US 6,642,589 B2

SEMICONDUCTOR DEVICE HAVING POCKET AND MANUFACTURE THEREOF

This application is based on and claims priority of Japanese patent application 2001-198594, filed on Jun. 29, 2001, the whole contents of which are incorporated herein by reference.

BACKGROUND OF THE INVENTION

A) Field of the Invention

The present invention relates to a semiconductor device and its manufacture method, and more particularly to a semiconductor device having pocket regions for suppressing the short channel effect and its manufacture method.

B) Description of the Related Art

With the advent of finer semiconductor devices, there arises a problem of the short channel effect relative to a threshold value of a transistor. As a countermeasure for this problem, a pocket structure has been proposed. In an n-channel MOS transistor, p-type pocket regions are formed under the opposite ends of the gate. Boron (B) is widely used as impurities for forming pocket regions. Indium (In) is also used recently as impurities for forming p-type pocket regions.

An n-channel MOS transistor using indium as the impurities for forming pocket regions has the following advantages:

a large suppression ability of the short channel effect; and
an improved drive capacity.

These advantages may be ascribed to a larger atomic weight (115) of indium than that (11) of boron, which makes indium atoms difficult to segregate and diffuse.

With reference to FIGS. 4A to 4D, a conventional method of manufacturing a semiconductor device having pocket regions will be described.

As shown in FIG. 4A, an isolation region 2 is formed in a principal surface of a silicon substrate 1. In the structure shown in FIG. 4A, an isolation trench is formed in the silicon substrate 1 and filled with insulating material such as silicon oxide. Unnecessary insulating material deposited on the surface of the silicon substrate 1 is removed by chemical mechanical polishing (CMP) or the like to form a shallow trench isolation (STI) structure.

Instead of STI, local oxidation of silicon (LOCOS) may be used for forming an isolation region. The isolation region 2 defines a number of active regions. In the following description, an active region for forming an n-channel MOS transistor is used by way of example.

Boron ions are implanted into the active region of the silicon substrate 1 at an acceleration energy of 300 keV and a dose of about $3.0 \times 10^{13}$ cm$^{-2}$ to thereby form a p-type well 3. Next, boron ions are implanted at an acceleration energy of 30 keV and a dose of about $5.0 \times 10^{12}$ cm$^{-2}$ to form a channel region with an adjusted threshold value.

A gate insulating film 4 is formed on the surface of the active region, and a gate electrode layer of polysilicon, polycide or the like is formed on the gate insulating film 4. The gate electrode layer and gate insulating film are patterned by using a resist mask to form an insulated gate electrode 5 with the gate insulating film 4.

As shown in FIG. 4B, by using the insulated gate electrode as a mask, arsenic (As) ions are implanted at an acceleration energy of 5 keV and a dose of about $3.0 \times 10^{15}$ cm$^{-2}$ to form shallow extension regions 6.

As shown in FIG. 4C, pocket regions 7 are formed under the extension regions 6. For example, indium ions are implanted at an acceleration energy of 100 keV and a dose of about $6.3 \times 10^{13}$ cm$^{-2}$ along four directions tilted by 30 degrees from the substrate normal to form indium doped regions 7.

As shown in FIG. 4D, an insulating layer of silicon oxide or the like is deposited covering the insulated gate electrode 5. The insulating layer is anisotropically etched to leave only side wall spacers 8 on the side walls of the insulated gate electrode 5.

By using the insulated gate electrode and side wall spacers as a mask, n-type impurities are implanted to form deep source/drain regions 9. For example, phosphorous (P) ions are implanted at an acceleration energy of 15 keV and a dose of about $5.0 \times 10^{15}$ cm$^{-2}$. The deep source/drain regions 9 are made for forming good contact with metal electrodes. If a silicide layer is formed to lower the resistance of the source/drain regions, compound of metal and silicon is formed on the surfaces of the source/drain regions 9.

The semiconductor substrate after the ion implantation processes is heated by lamp heating to activate the impurities. For example, the lamp heating is performed at 1025° C. for about 3 seconds.

An n-channel MOS transistor having pocket regions containing indium has the advantages of suppressing the short channel effect and improving the drive capacity. However, junction leak current increases. Leak current of a narrow channel transistor also increases because of the inverse narrow channel effect.

SUMMARY OF THE INVENTION

It is an object of the present invention to provide a semiconductor device having n-channel MOS transistors with pocket regions containing indium, the semiconductor device being able to suppress an increase in leak current to be caused by the use of indium.

It is another object of the invention to provide a method of manufacturing a semiconductor device having pocket regions formed by indium ion implantation, the method being able to suppress an increase in leak current to be caused by the use of indium.

According to one aspect of the present invention, there is provided a semiconductor device comprising: a silicon substrate having a principal surface; first and second active regions defined by an isolation region formed in a principal surface of said silicon substrate; a first n-channel MOS transistor comprising a first insulated gate with a gate insulating film formed in said first active region, first extension regions formed in said first active region on both sides of the first insulated gate, and first pocket regions formed in said first active region on both sides of the first insulated gate at a deeper position than the first extension regions, the first pocket regions being doped with indium at a first concentration; and a second n-channel MOS transistor comprising a second insulated gate with a gate insulating film formed in said second active region, second extension regions formed in said second active region on both sides of the second insulated gate, and second pocket regions formed in said second active region on both sides of the second insulated gate at a deeper position than the second extension regions, the second pocket regions being doped with indium at a second concentration lower than the first concentration.

According to another aspect of the invention, there is provided a semiconductor device comprising: a silicon substrate having a principal surface; first and second active regions defined by an isolation region formed in a principal surface of said silicon substrate; a first n-channel MOS transistor comprising a first insulated gate with a gate insulating film formed in said first active region, first side wall spacers formed on both side walls of the first insulated gate, first extension regions formed in said first active region on both sides of the first insulated gate, and first pocket regions formed in said first active region on both sides of the first insulated gate at a deeper position than the first extension regions, the first pocket regions being doped with indium at a first concentration, and said first n-channel MOS transistor including regions of amorphous phase under the first side wall spacers; and a second n-channel MOS transistor comprising a second insulated gate with a gate insulating film formed in said second active region, second side wall spacers formed on both side walls of the second insulated gate, second extension regions formed in said second active region on both sides of the second insulated gate, and second pocket regions formed in said second active region on both sides of the second insulated gate at a deeper position than the second extension regions, the second pocket regions being doped with indium at a second concentration lower than the first concentration, and said second n-channel MOS transistor including smaller regions of amorphous phase under the second side wall spacers that the regions of amorphous phase under the first side wall spacers.

According to a further aspect of the present invention, there is provided a method of manufacturing a semiconductor device comprising the steps of: (a) forming an isolation region in a silicon substrate having a principal surface to define first and second active regions; (b) forming a gate insulating film in the first and second active regions; (c) forming a conductive gate electrode layer on the gate insulating film; (d) pattering the gate electrode layer and the gate insulating film to form a first insulated gate on the first active region and a second insulated gate on the second active region; (e) implanting n-type impurity ions into the first and second active regions to a first depth to form first and second extension regions on both sides of each of the first and second insulated gates;(f) masking the second active region and implanting indium ions at a first dose into the first active region to a second depth deeper than the first depth; and (g) masking the first active region and implanting indium ions at a second dose smaller than the first dose into the second active region to a third depth deeper than the first depth.

An increase in leak current and generation of an amorphous phase can be suppressed by limiting the dose of indium for forming pocket regions.

Doping boron compensates for the insufficient effect of suppressing the short channel effect.

As above, while the advantages of forming pocket regions by implanting indium ions are retained, an increase in leak current to be caused by the use of indium can be suppressed.

BRIEF DESCRIPTION OF THE DRAWINGS

FIGS. 3A to 3D are cross sectional views illustrating manufacture processes for high breakdown voltage transistors and a plan view of a semiconductor chip.

FIGS. 4A to 4D are cross sectional view of a semiconductor chip illustrating a conventional method of manufacturing a semiconductor device.

DESCRIPTION OF THE PREFERRED EMBODIMENTS

Prior to describing the embodiments of the invention, an n-channel MOS transistor having pocket regions containing indium will be described. An increase in junction leak current of an n-channel MOS transistor to be caused by the pocket region containing indium has been suggested as having a relation to residue of an amorphous phase.

Regions of amorphous phase formed during ion implantation are recovered to the crystal phase by a thermal annealing process after ion implantation. As transistors are made finer recently, thermal budget of the thermal annealing process is becoming lower. From this reason, the amorphous phase regions cannot sufficiently recover the crystal phase. It has been indicated that there are residue regions of amorphous phase under side wall spacers of a transistor which is implanted with indium and has an increased junction leak current.

Activation factor of indium is lower than that of boron. There is a tendency that the influence of a dose of indium used for transistor threshold value adjustment becomes less than boron. In order to obtain the same transistor threshold value, indium is required to be doped in amount more than boron. An increase in the dose will help formation of amorphous phase.

Memory cells such as a static random access memory (SRAM) are made of transistors having narrower gate widths than those of logic circuit transistors, in order to improve the integration degree.

Generally, as the gate width of a transistor becomes narrower, the threshold voltage increases, which is called the narrow channel effect. In a semiconductor device utilizing shallow trench isolation, as the gate width becomes narrower, the threshold value becomes lower. The phenomenon that the threshold voltage lowers with a decrease in a gate width is called the inverse narrow channel effect. In a device using indium for forming p-type pocket regions, the inverse narrow channel effect becomes more conspicuous than a device using boron. A lowered threshold voltage is likely to involve an increase in leak current.

Figure 5:
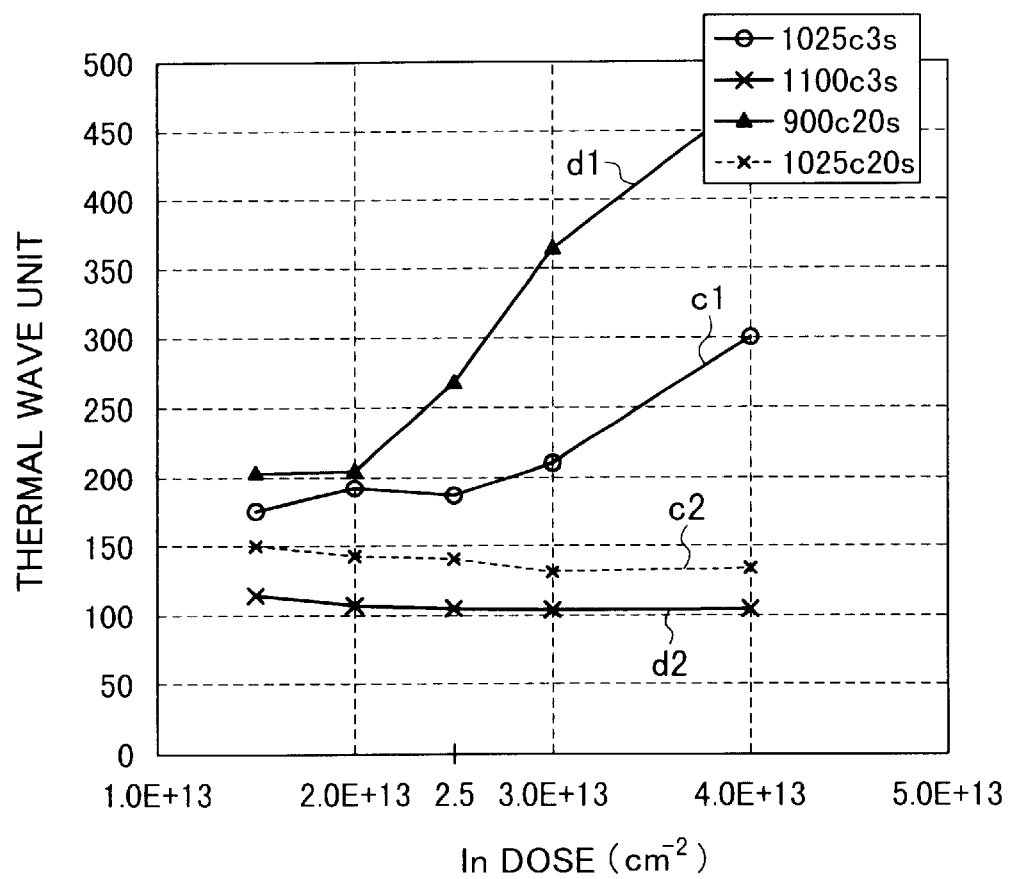
FIG. 5 is a graph showing thermal wave measurement results of transistors having pocket regions containing indium.

FIG. 5 is a graph showing experiment results of thermal wave measured by the present inventors. Sample n-channel MOS transistors such as shown in FIG. 4D were formed having pocket regions 7 formed by implanting indium ions at various doses and by changing the conditions of the thermal annealing process after the ion implantation.

Thermal waves having a predetermined frequency were applied to these samples, and reflected thermal waves were measured to obtain thermal wave units (reflectivities) If there is an amorphous region in the semiconductor substrate, this amorphous region presents a function of increasing reflections of thermal waves. Therefore, a high reflectivity of thermal waves suggests an increase in the amorphous region.

In FIG. 5, the abscissa represents dose of indium and the ordinate represents thermal wave unit (reflectivity). The dose of indium was changed as $1.5 \times 10^{13}$ cm$^{-2}$, $2.0 \times 10^{13}$ cm$^{-2}$, $2.5 \times 10^{13}$ cm$^{-2}$, $3.0 \times 10^{13}$ cm$^{-2}$, and $4.0 \times 10^{13}$ cm$^{-2}$ and the four annealing conditions were used including at 1025° C. for 3 seconds, at 1025° C. for 20 seconds, at 1100° C. for 3 seconds, and at 900° C. for 20 seconds.

The measurement results of samples subjected to the annealing process at 1025° C. for 3 seconds are indicated by a curve c1. The measurement results of samples subjected to the annealing process at 1025° C. for 20 seconds are indicated by a curve c2. As seen from the curve c1, as the indium dose exceeds $2.5 \times 10^{13}$ cm$^{-2}$, the thermal wave unit gradually rises. As the indium dose exceeds about $3.5 \times 10^{13}$ cm$^{-2}$, the thermal wave unit rises more than about 20% as compared to the generally flat wave unit in the low dose area.

As seen from the curve c2, as the time of the thermal annealing process at 1025° C. is prolonged from 3 seconds to 20 seconds, the thermal wave unit takes generally a flat value independently from the indium dose.

This may be ascribed to the state that the amorphous phase formed by indium implantation almost perfectly recovers a crystal phase. However, this thermal annealing condition influences finer devices more in other points such as a junction shape.

The characteristics indicated by a curve d1 were obtained for the thermal annealing process at a lowered temperature of 900° C. for 20 seconds. As seen from the curve d1, as the indium dose exceeds $2.0 \times 10^{13}$ cm$^{-2}$, a definite increase in the thermal wave unit appears. The thermal wave unit at the indium dose of $2.5 \times 10^{13}$ cm$^{-2}$ increases by about 30% as compared to the generally flat thermal wave unit in the low dose area.

The characteristics indicated by a curve d2 were obtained for the thermal annealing process at a raised temperature of 1100° C. for 3 seconds. As seen from the curve d2, even the indium dose is increased, a rise of the thermal wave unit is not recognized and generally the flat characteristics are obtained. However, this thermal annealing condition at 1100° C. for 3 seconds influences finer devices more in other points such as a junction shape.

It can be judged from the measurement results shown in FIG. 5 that the indium dose is preferably set to about $3.5 \times 10^{13}$ cm$^{-2}$ or smaller for the heat treatment at 1025° C. for 3 seconds, from the viewpoint of suppressing the amorphous phase. It is preferable to set the indium dose to about $2.5 \times 10^{13}$ cm$^{-2}$ or smaller for the heat treatment at 900° C. for 20 seconds.

Next, embodiments of the invention will be described. FIGS. 1A to 1E are cross sectional views of a semiconductor chip illustrating main processes of a method of manufacturing standard transistors permitted to increase leak current and low leak current transistors with pocket regions containing indium, respectively formed on a single semiconductor chip. Description will first be made mainly on the manufacture of n-channel transistors.

Figure 1A:
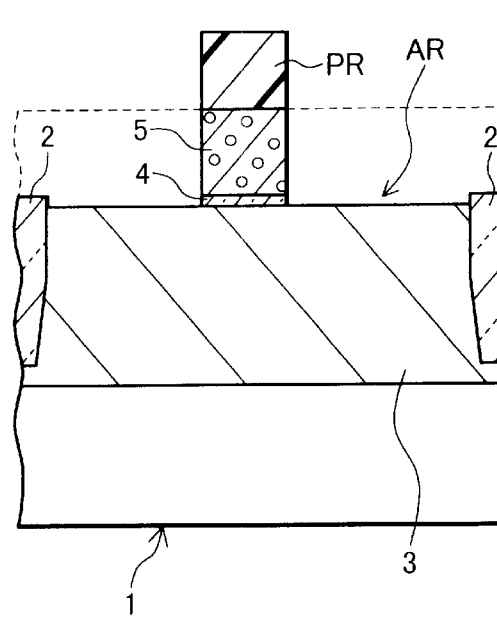
FIGS. 1A to 1E are cross sectional views illustrating manufacture processes for a semiconductor device having n-channel MOS transistors according to an embodiment of the invention.

As shown in FIG. 1A, an isolation region 2 is formed by STI in the principal surface of a silicon substrate 1. The isolation region 2 defines a number of active regions AR on the principal surface of the silicon substrate 1.

A p-channel area is covered with a mask such as resist, and B$^+$ ions are implanted into an n-channel area at an acceleration energy of 300 keV and a dose of $3.0 \times 10^{13}$ cm$^{-2}$ to form a p-type well 3. B$^+$ ions are further implanted into a surface layer of the substrate at an acceleration energy of 30 keV and a dose of $5.0 \times 10^{12}$ cm$^{-2}$ to form a channel with an adjusted threshold value.

The n-channel region is covered with a mask such as resist to perform another ion implantation for the p-channel area.

A thin gate insulating film 4 is formed on the active regions, and a conductive gate electrode layer of polysilicon, polycide or the like is formed on the gate insulating film 4. For example, the gate insulating film 4 is made of a silicon oxide film having a thickness of about 5 to 10 nm and formed by thermal oxidation or the like. A resist mask PR is formed on the gate electrode layer, and the gate electrode layer and gate insulating film are patterned to form an insulated gate electrode 5 and a gate insulating film 4. Thereafter, the resist mask PR is removed.

Figure 1B:
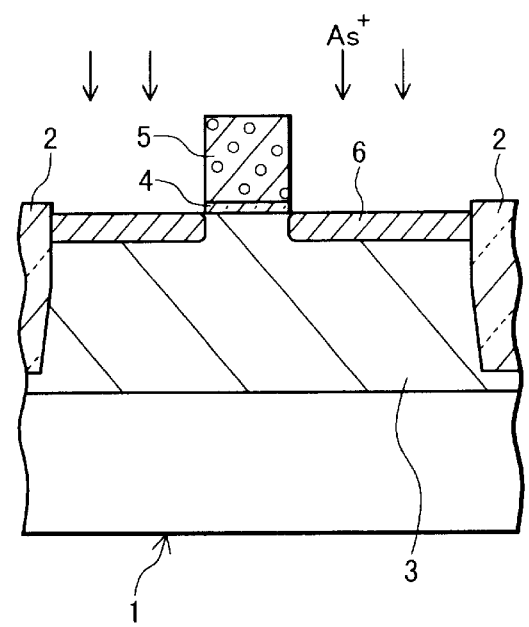

As shown in FIG. 1B, by using the insulated gate electrode 5 and STI region 2 as a mask, As ions are implanted into the active region in the n-channel area at an acceleration energy of 5 keV and a dose of about $3.0 \times 10^{15}$ cm$^{-2}$ to form shallow source/drain extension regions 6.

During this ion implantation, the p-channel area is covered with a resist mask. Another ion implantation is performed for forming p-type extension regions of the p-channel area by covering the n-channel area with a mask such as resist.

The above processes are used in common for both standard transistors and low leak current transistors.

Figure 1C:
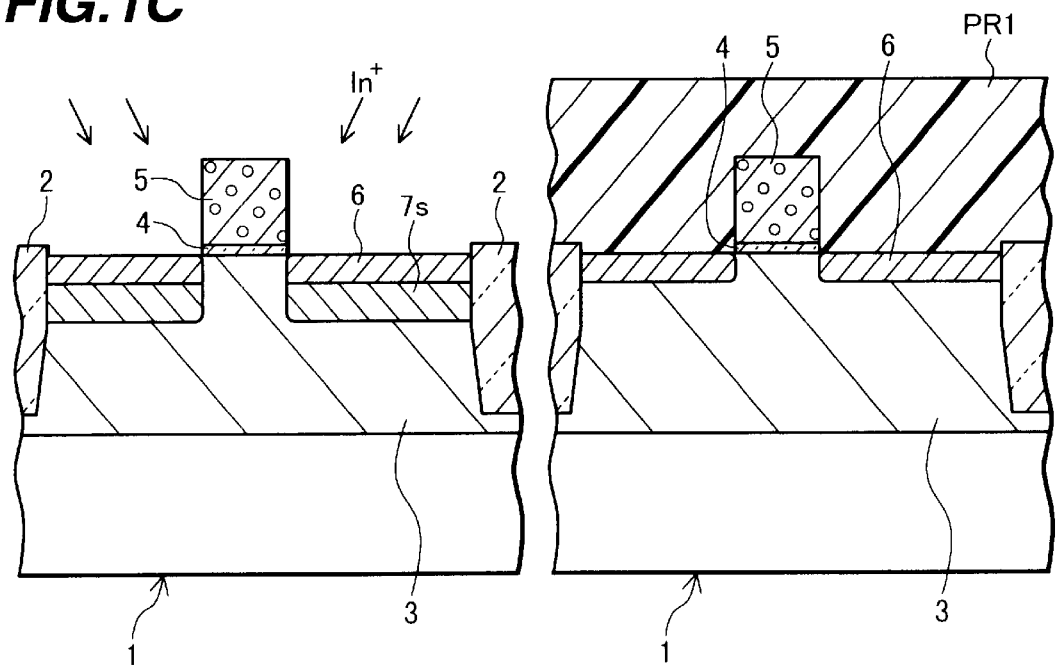

In FIG. 1C, a standard transistor is shown on the left side and a low leak current transistor is shown in the right side. As shown in FIG. 1C, the active region of a low leak current transistor is covered with a resist mask PR1, and In$^+$ ions are implanted into the active region of an n-channel standard transistor at an acceleration energy of 100 keV and a total dose of about $6.3 \times 10^{13}$ cm$^{-2}$ to form pocket regions 7 under the shallow extension regions. The resist mask PR1 is thereafter removed.

The ion implantation is performed along four directions tilted by about 30 degrees from the substrate normal. By tilting the ion implantation direction, the p-channel pocket regions extending or penetrating under the opposite end regions of the insulated gate can be formed.

Figure 1D:
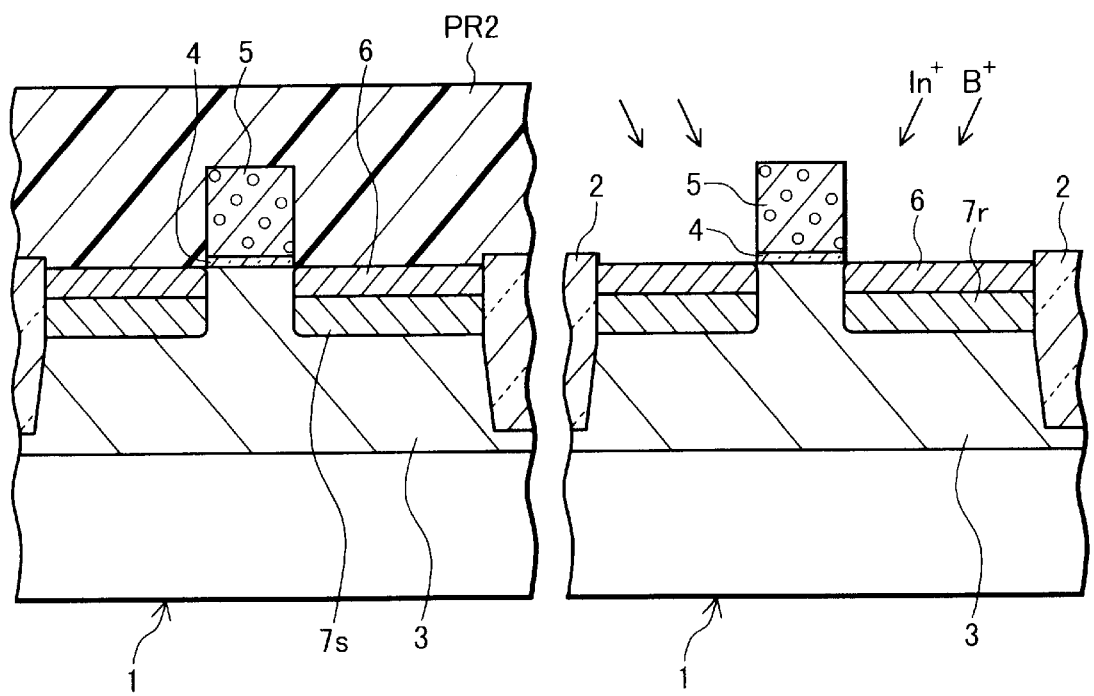

As shown in FIG. 1D, the standard transistor area is covered with a resist mask PR2, and ions are implanted into the active region of an n-channel low leak current transistor to form pocket regions. First, In$^+$ ions are implanted at an acceleration energy of 100 keV and a total dose (of four implantations) of about $3.4 \times 10^{13}$ cm$^{-2}$. Then, B$^+$ ions are implanted at an acceleration energy of 10 keV and a total dose of about $2.0 \times 10^{13}$ cm$^{-2}$. This ion implantation is also performed along four directions tilted by 30 degrees from the substrate normal.

In the above manner, for the pocket regions of a low leak current n-channel MOS transistor, the In ion dose is limited to suppress the generation of an amorphous phase. The insufficient effect of suppressing the short channel effect is compensated by further implanting B ions. Thereafter, the resist mask PR2 is removed. The processes described with FIGS. 1C and 1D are used for the n-channel MOS transistor. Other ion implantation processes are performed for the pocket regions of the p-channel MOS transistor.

Figure 1E:
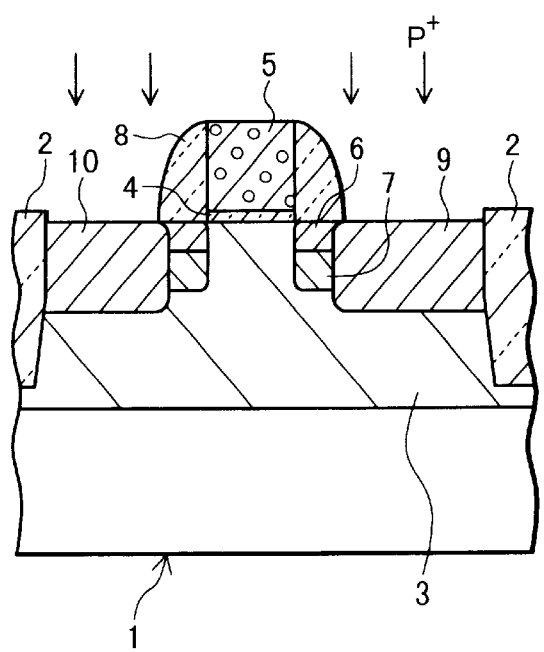

As shown in FIG. 1E, an insulating layer such as a silicon oxide layer is deposited covering the insulated gate electrode 5, and anisotropic etching is performed to leave only side wall spacers 8 on the side walls of the insulated gate electrode.

By using the insulated gate electrode 5 and side wall spacers 8 as a mask, n-type impurities, e.g., P$^+$ ions, are implanted at an acceleration energy of 15 keV and a dose of about $5.0\times10^{15}$ cm$^{-2}$ to form deep source/drain regions 9. Since the deep source/drain regions 9 are formed outside the side wall spacers, the extension regions 6 and pocket regions 7 are left under the side wall spacers.

Figure 2A:
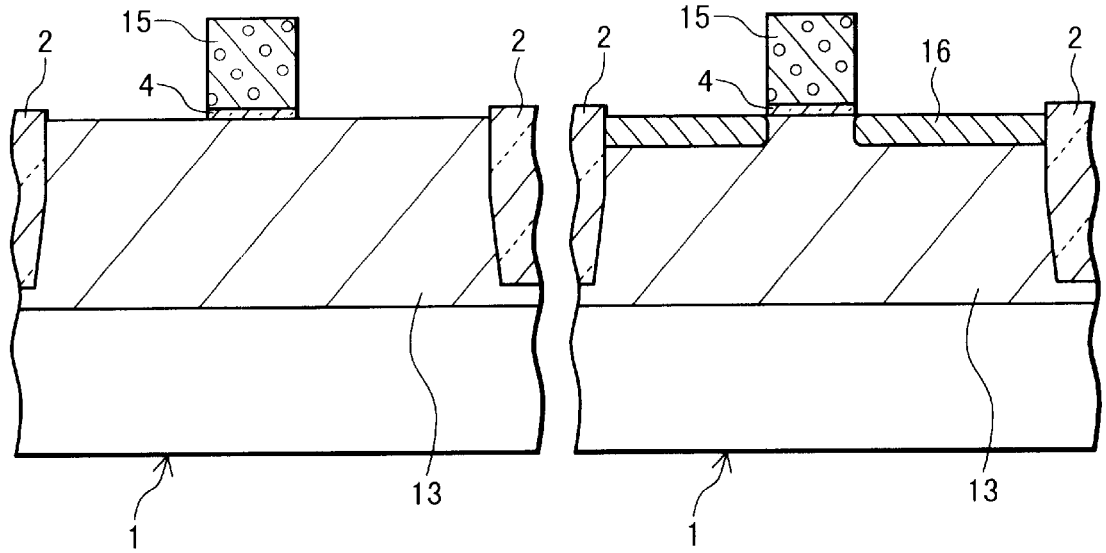
FIGS. 2A to 2D are cross sectional views illustrating manufacture processes for p-channel MOS transistors.
Figure 2B:
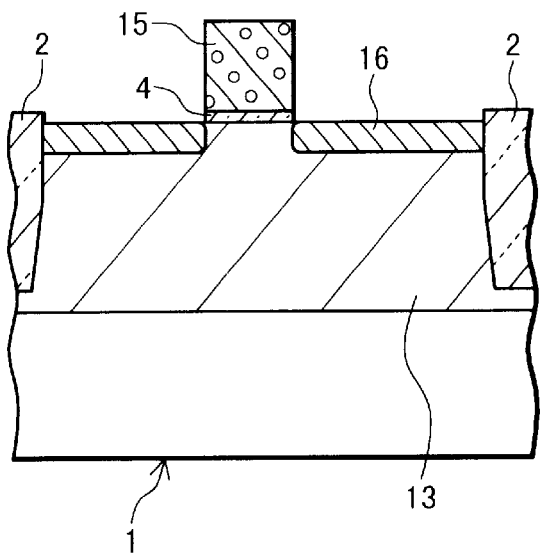
Figure 2C:
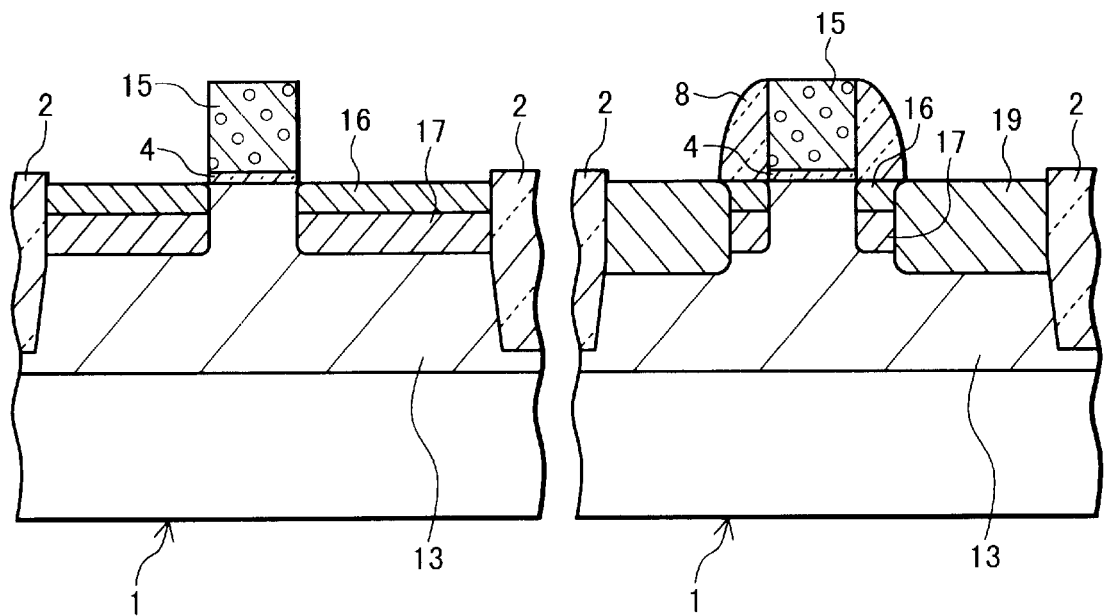

FIGS. 2A to 2C are cross sectional views illustrating manufacture processes for a p-channel MOS transistor in a p-channel area. It will be apparent to those skilled in the art that some processes can be performed commonly for the n-channel and p-channel transistors.

As shown in FIG. 2A, an isolation region 2 is formed by STI described earlier in the principal surface of a silicon substrate 1. Into the p-channel active region, n-type impurities, e.g., P$^+$ ions, are implanted at an acceleration energy of 600 keV and a dose of about $3.0\times10^{13}$ cm$^{-2}$ to form an n-type well 13. Further, P$^+$ ions are implanted at an acceleration energy of 80 keV and a dose of about $2.0\times10^{12}$ cm$^{-2}$ to form a channel with an adjusted threshold value.

A gate insulating film 4 of silicon oxide or the like is formed on the active region, and a gate electrode layer of polysilicon, silicide or the like is formed on the gate insulating film 4. The gate electrode layer and gate insulating film 4 are patterned to form an insulated gate electrode 15 with the gate insulating film 4. The polysilicon gate electrode 15 is doped with impurities to have a p-type conductivity.

As shown in FIG. 2B, by using the gate electrode 15 and isolation region 2 as a mask, B$^+$ ions are implanted, for example, at an acceleration energy of 1 keV and a dose of about $3.0\times10^{14}$ cm$^{-2}$ to form shallow source/drain extension regions 16.

As shown in FIG. 2C, As$^+$ ions are implanted at an acceleration energy of 80 keV and a dose of about $3.0\times10^{13}$ cm$^{-2}$ to form n-type pocket regions 17 under the source/drain extension regions. This ion implantation is performed along four directions tilted by 30 degrees from the substrate normal.

Figure 2D:
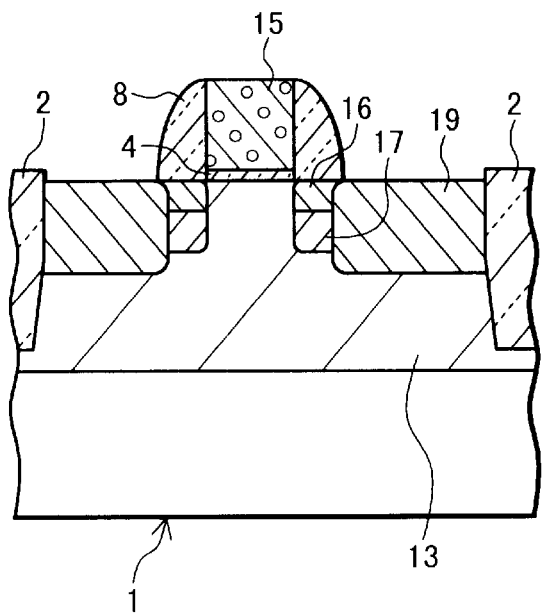

As shown in FIG. 2D, side wall spacers 8 are formed on the side walls of the insulated gate electrode 15 by the processes described earlier.

Thereafter, B$^+$ ions are implanted at an acceleration energy of 5 keV and a dose of about $5.0\times10^{15}$ cm$^{-2}$ to form deep source/drain regions 19.

The pocket region containing As does not pose a problem of the generation of leak current and the like as in the case of the pocket region containing In. It is therefore unnecessary to separately form standard transistors and low leak current transistors.

FIGS. 3A to 3C illustrate manufacture processes for high breakdown voltage transistors of an input/output circuit or the like.

As shown in FIG. 3A, by using the processes similar to those of the above-described embodiments, an isolation region 2 is formed. In the following, manufacture processes for an n-channel MOS transistor are described by way of example.

B$^+$ ions are implanted at an acceleration energy of 300 keV and a dose of about $3.0\times10^{13}$ cm$^{-2}$ to form a p-type well 23. Further, B$^+$ ions are implanted at an acceleration energy of 30 keV and a dose of about $7.0\times10^{12}$ cm$^{-2}$ to form a channel region.

A thick gate insulating film 14, compared to that of the standard and low leak transistors, is formed on the active region, and a gate electrode layer is formed on the gate insulating film 14. The thickness of the gate insulating film is controlled so that a desired breakdown voltage can be obtained. For example, the oxidation process for the surface of the active region is performed at two stages. During the intermediate stage between the two stages, an oxide film is removed which was formed in an area other than the area where a thick gate insulating film is to be formed. In this manner, a thick gate insulating film and a thin gate insulating film are formed.

The gate electrode layer and gate insulating film are patterned by using a resist mask to form a gate electrode 25 and a gate insulating film 14.

As shown in FIG. 3B, As$^+$ ions are implanted at an acceleration energy of 10 keV and a dose of about $3.0\times10^{14}$ cm$^{-2}$ to form source/drain extension regions 6.

As shown in FIG. 3C, after side wall spacers 8 are formed on the side walls of the gate electrode 25 by the processes similar to those of the embodiments described earlier, P$^+$ ions are implanted, for example, at an acceleration energy of 15 keV and a dose of about $5\times10^{15}$ cm$^{-2}$ to form deep source/drain regions 29.

The high breakdown transistor is not made too fine and pocket regions are not formed. It is noted that some processes are performed in common for different types of transistors.

FIG. 3D is a plan view showing the outline of the layout of a semiconductor chip formed by the processes described above. A semiconductor chip 30 has an input/output circuit 31, a memory circuit 32 and a logic circuit 33. The input/output circuit 31 has high breakdown voltage transistors such as shown in FIG. 3C. The memory circuit 32 is made of, for example, static random access memories (SRAM) formed by low leak current n-channel transistors. The logic circuit 33 is constituted of a CMOS circuit formed of n-channel standard transistors having a gate width wider than that of a low leak current transistor of a memory cell and p-channel transistors having pocket regions.

Figure 6:
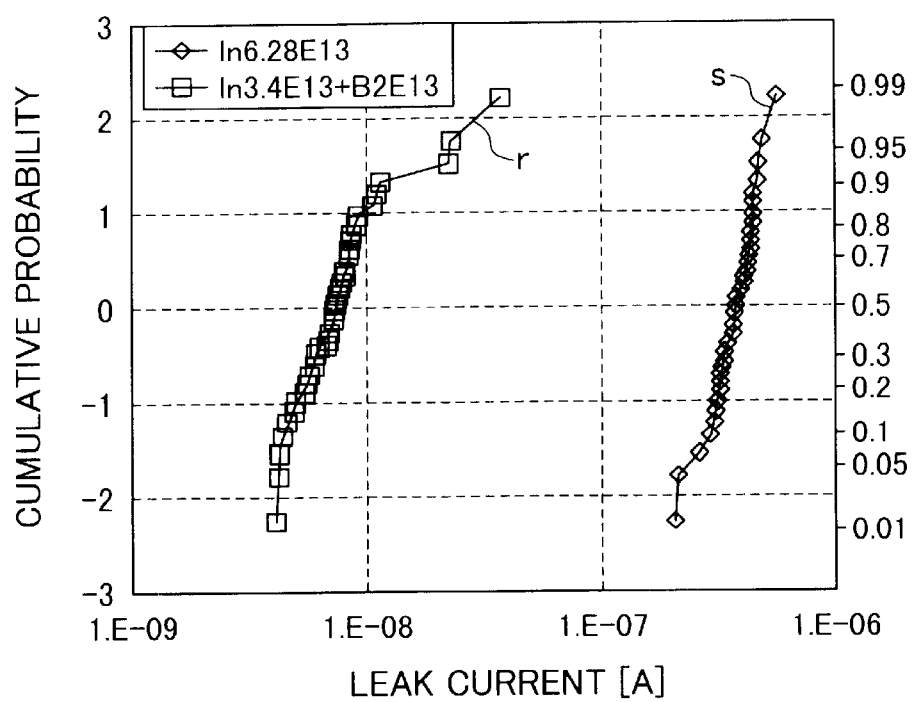
FIG. 6 is a graph showing the leak current characteristics of transistors having pocket regions containing indium and pocket regions containing a mixture of indium and boron.

FIG. 6 is a graph showing leak current characteristics of standard transistors and low leak current transistors formed by the above-described embodiment methods. In FIG. 6, the abscissa represents leak current in the unit of ampere A and the ordinate represents a cumulative probability. A curve r shows the characteristics of low leak current transistors whose pocket regions contain indium ions implanted at $3.4\times10^{13}$ cm$^{-2}$ and boron ions implanted at $2.0\times10^{13}$ cm$^{-2}$. A curve s shows the characteristics of standard transistors whose pocket regions contain indium ions implanted at $6.28\times10^{13}$ cm$^{-1}$.

As apparent from FIG. 6, there is a large difference between leak currents by one digit or larger. It is apparent that leak current lowers greatly by limiting the dose of indium ions. This may be ascribed to that as the indium dose is reduced, the degree of amorphism is suppressed so that the amorphous phase region can sufficiently recover the crystal phase by an annealing process. An increase in leak current may be ascribed to that as the indium dose is increased to a certain value or higher, the amorphous region unable to recover the crystal region increases.

Figure 7A:
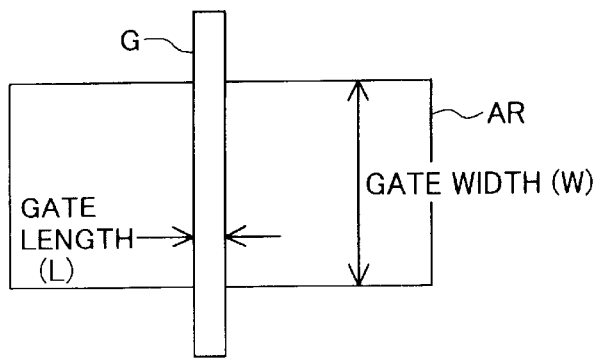
FIGS. 7A to 7C are a schematic plan view of a transistor and graphs showing dependencies of threshold values of standard transistors and low leak transistors upon gate widths and lengths.
Figure 7B:
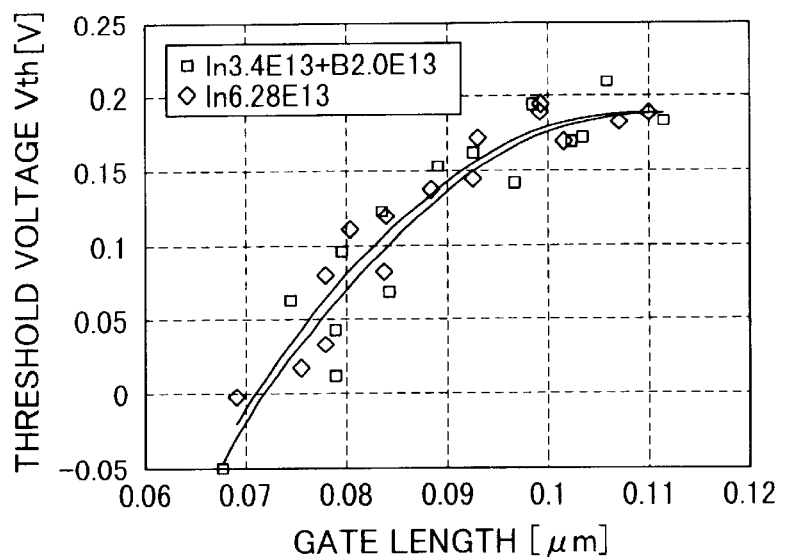
Figure 7C:
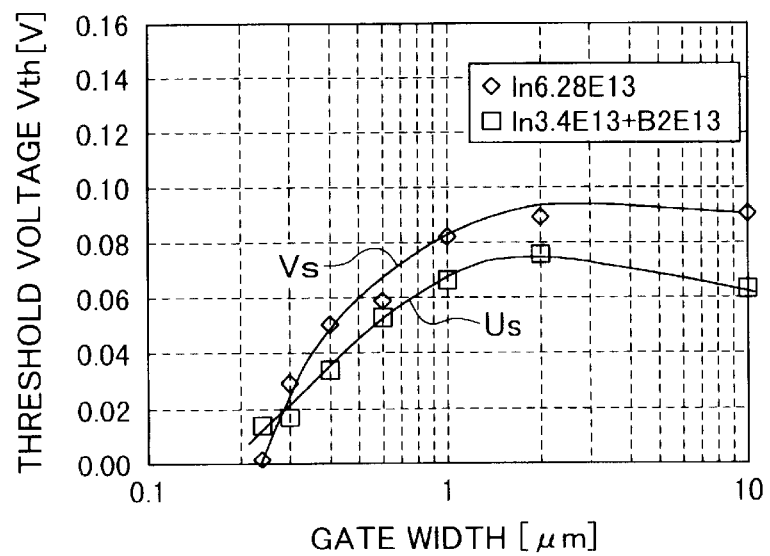

FIGS. 7A to 7C are a schematic plan view of a transistor and graphs showing dependencies of threshold voltages upon gate widths and lengths.

As shown in FIG. 7A, the gate electrode G formed above an active region AR has a gate length L which is the width of the gate electrode (length along a current direction) and a gate width W which is the width of the active region along the direction perpendicular to the current direction.

FIG. 7B is a graph showing the dependency of a transistor threshold voltage upon a gate length. In FIG. 7B, the abscissa represents the gate length L in the unit of μm and the ordinate represents the transistor threshold voltage Vth in the unit of volt V. This graph shows the characteristics of standard transistors whose pocket regions contain only In and the characteristics of low leak current transistors whose pocket regions contain two types of impurities, i.e. In and B. The threshold voltages of these two types of transistors are generally equal. This means that the low leak current transistor maintains the characteristics of suppressing the short channel effect similar to the characteristics of the standard transistor.

FIG. 7C is a graph showing the dependency of a transistor threshold voltage upon a gate width. In FIG. 7C, the abscissa represents the gate width W in the unit of μm and the ordinate represents the transistor threshold voltage Vth in the unit of volt V. The threshold voltage Vs of the standard transistor lowers as the gate width W is narrowed, and eventually reaches near 0. In contrast, the threshold voltage Us of the low leak current transistor whose pocket regions contain both In and B has a finite value even if the gate width W is narrowed (narrow channel). The low leak current transistor can be obtained which suppresses the influence of the inverse narrow channel effect.

A memory circuit such as SRAM is made of low leak current transistors having a narrow gate width, e.g., 0.05 to 0.5 μm in order to improve the integration degree. A logic circuit is made of standard transistors having a wider gate width, e.g., 1 to 10 μm.

If B is used as p-type impurities, instead of atomic boron, boron compound such as $BF_2$ and decaborane may also be used as ion sources. In the above description, although a logic circuit is made of standard transistors, it may be made of a combination of standard transistors and low leak current transistors or made of only low leak current transistors. A notch gate may be used as a gate.

The present invention has been described in connection with the preferred embodiments. The invention is not limited only to the above embodiments. It will be apparent to those skilled in the art that various modifications, improvements, combinations, and the like can be made.

What is claimed is:

1. A method of manufacturing a semiconductor device comprising the steps of:
   (a) forming an isolation region in a silicon substrate having a principal surface to define first and second active regions;
   (b) forming a gate insulating film in the first and second active regions;
   (c) forming a conductive gate electrode layer on the gate insulating film;
   (d) patterning the gate electrode layer and the gate insulating film to form a first insulated gate on the first active region and a second insulated gate on the second active region;
   (e) implanting n-type impurity ions into the first and second active regions to a first depth to form first and second extension regions on both sides of each of the first and second insulated gates;
   (f) masking the second active region and implanting indium ions at a first dose into the first active region to a second depth deeper than the first depth; and
   (g) masking the first active region and implanting indium ions at a second dose smaller than the first dose into the second active region to a third depth deeper than the first depth.

2. The method of manufacturing a semiconductor device according to claim 1, further comprising the step of:
   (h) masking the first active region and implanting boron ions into the second active region to a fourth depth deeper than the first depth.

3. The method of manufacturing a semiconductor device according to claim 2, further comprising the steps of:
   (i) forming side wall spacers on side walls of each of the first and second insulated gates;
   (j) implanting n-type impurity ions into the first and second active regions outside the side wall spacers; and
   (k) radiating light to the first and second active regions to activate the impurity ions.

4. The method of manufacturing a semiconductor device according to claim 2, wherein said step (a) further defines a fourth active region, and the method further comprises the steps of:
   (m) forming a fourth insulated gate in the fourth active region;
   (n) implanting p-type impurity ions into the fourth active region to a fifth depth to form fourth extension regions on both sides of the fourth insulated gate; and
   (o) implanting arsenic ions into the fourth active region to a sixth depth deeper than the fifth depth.

5. The method of manufacturing a semiconductor device according to claim 1, further comprising the steps of:
   (i) forming side wall spacers on side walls of each of the first and second insulated gates;
   (j) implanting n-type impurity ions into the first and second active regions outside the side wall spacers; and
   (k) radiating light to the first and second active regions to activate the impurity ions.

6. The method of manufacturing a semiconductor device according to claim 1, wherein said step (a) further defines a third active region, and the method further comprises the step of:
   (l) forming a thick gate insulating film thicker than the gate insulating film in the third active region,
   said steps (c) and (d) form a third insulated gate in the third active region, and said steps (f) and (g) are executed by masking the third active region.

7. The method of manufacturing a semiconductor device according to claim 6, wherein said step (a) further defines a fourth active region, the method further comprises the steps of:
   (m) forming a fourth insulated gate in the fourth active region;
   (n) implanting p-type impurity ions into the fourth active region to a fifth depth to form fourth extension regions on both sides of the fourth insulated gate; and
   (o) implanting arsenic ions into the fourth active region to a sixth depth deeper than the fifth depth.

8. The method of manufacturing a semiconductor device according to claim 1, wherein said step (a) further defines a fourth active region, and the method further comprises the steps of:
   (m) forming a fourth insulated gate in the fourth active region;
   (n) implanting p-type impurity ions into the fourth active region to a fifth depth to form fourth extension regions on both sides of the fourth insulated gate; and
   (o) implanting arsenic ions into the fourth active region to a sixth depth deeper than the fifth depth.

* * * * *